United States Patent [19]

Brown

[11] Patent Number: 4,619,837
[45] Date of Patent: Oct. 28, 1986

[54] POLYMERIZABLE PLANARIZATION LAYER FOR INTEGRATED CIRCUIT STRUCTURES

[75] Inventor: Andrew V. Brown, San Jose, Calif.

[73] Assignee: Advanced Micro Devices, Inc., Sunnyvale, Calif.

[21] Appl. No.: 697,363

[22] Filed: Feb. 1, 1985

[51] Int. Cl.⁴ .............................................. B05D 3/06
[52] U.S. Cl. .................................... 427/44; 427/54.1; 427/96
[58] Field of Search ...................... 427/44, 54.1, 43.1, 427/96

[56] References Cited

U.S. PATENT DOCUMENTS

| | | | |
|---|---|---|---|
| 4,171,979 | 10/1979 | Novak et al. ........................ | 427/54.1 |
| 4,258,079 | 3/1981 | Economy et al. .................... | 427/379 |
| 4,339,526 | 7/1982 | Baise et al. .......................... | 427/96 |
| 4,427,713 | 1/1984 | White et al. ......................... | 427/54.1 |
| 4,510,173 | 4/1985 | Higashikawa et al. ................ | 427/44 |
| 4,518,828 | 5/1985 | Economy et al. ..................... | 427/82 |

OTHER PUBLICATIONS

White *Journ. Electrochem. Soc. Sol. State Sci. and Tech.* Jul. 1983, pp. 1543–1548.

*Primary Examiner*—John H. Newsome
*Attorney, Agent, or Firm*—Patrick T. King; John P. Taylor; Eugene H. Valet

[57] ABSTRACT

The invention comprises an improvement in the process of manufacturing an integrated circuit structure having stepped topography which comprises coating the integrated circuit structure with a polymerizable material in the substantial absence of a solvent and then polymerizing the material to provide a substantially planar surface on the integrated circuit structure.

15 Claims, 3 Drawing Figures

POLYMERIZABLE PLANARIZATION LAYER FOR INTEGRATED CIRCUIT STRUCTURES

BACKGROUND OF THE INVENTION

1. Field of the Invention

This invention relates to integrated circuit structures. More particularly, this invention relates to an improvement in the formation of a planarization layer for an integrated circuit structure.

2. Description of the Prior Art

In the construction of integrated circuit structures, the use of a photoresist to form a mask over nonplanar underlying layers having steps can result in line width deviations due to thin film interference effects or as a result of bulk light absorption differences due to variations in photoresist thicknesses. To achieve a substantially planar photoresist surface, it has been proposed to coat the underlying topography of the integrated circuit structure with one or more polymer layers to achieve at least partial planarization before application of the photoresist layer.

For example, L. K. White, in "Planarization Properties of Resist and Polyimide Coatings", Journal of the Electrochemical Society Solid State Science and Technology, July, 1983, at pages 1543–1548, discusses multilayer planarization wherein a polymer dissolved in a solvent is applied to a wafer by spin coating. Two layers may be spun on at different speeds, e.g., 4000 and 7000 rpms, to attempt to achieve a more planar surface to which the photoresist may be applied. However, the author states that only slight improvements in the spun on planarization properties results through the use of such a multiple coating technique. Apparently this is due, at least in part, to the tendency of the second coating to mix or dissolve a portion of the initial coating to thereby increase the viscosity and per cent solids composition of the second polymer solution at the interface between the coatings. The author further discusses planarization techniques involving a positive photoresist polymer exposed to white light and then baked to obtain thermal flow.

Planarization using solvent based polymers presents additional difficulties in achieving the desired planarization due to the tendency of the solvent to evaporate during the application of the polymeric material to the integrated circuit wafer by conventional spinning techniques. This evaporation, in turn, changes the solution viscosity and, thus, changes the flow rate as the polymer spreads out on the spinning wafer. Furthermore, the subsequent evaporation of the solvent (after it has been spun across the entire surface of the wafer) involves a reduction of the total volume of the planarization material which, in turn, results in nonuniformity of the coating since thicker portions of the coating (over low points in the topography of the underlying integrated circuit structure) contain more solvent and, therefore, more solvent will be lost resulting in a larger reduction of the volume of the planarization coating at that point. Conversely, a lesser amount of coating over a high point on the integrated circuit structure results in much less solvent evaporation and, therefore, a smaller reduction in the volume content of the remaining polymer.

It would, therefore, be most desirable to use a planarization material which could be spread smoothly over an integrated circuit structure having varying topography wherein the material could be easily spread in liquid form across the surface without being subject to the variation in thickness due to solvent evaporation as in the present practices.

SUMMARY OF THE INVENTION

It is therefore an object of the invention to provide planarization of an integrated circuit structure using a material which does not contain a solvent which will evaporate.

It is another object of the invention to provide planarization of an integrated circuit structure using a material which does not contain an evaporatable solvent yet has an initial viscosity which permits uniform coating of the underlying topography.

It is yet another object of the invention to provide planarization of an integrated circuit structure using a material which does not contain a solvent which will evaporate and having a viscosity, prior to polymerization, sufficiently low to permit the uniform distribution of the material over the integrated circuit structure while permitting subsequent polymerization to occur which will result in the formation of a coating sufficiently solidified to provide a planarized base for the subsequent application of a photoresist layer thereto.

These and other objects of the invention will be apparent from the accompanying description and drawings.

In accordance with the invention, an integrated circuit structure has a planarization layer applied thereto comprising a polymerizable monomer which may be applied to the underlying topography as a liquid in the substantial absence of any solvents and subsequently polymerized to form a solidified structure having a planar surface suitable for subsequent application thereto of a layer of photoresist.

DESCRIPTION OF THE PREFERRED EMBODIMENTS

Figure 1:
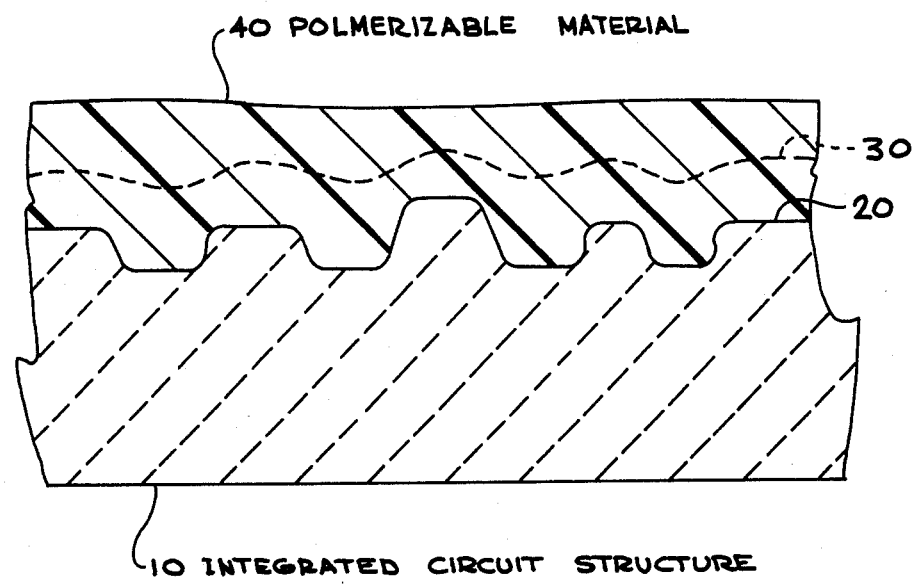
FIG. 1 is a cross section of a typical integrated circuit structure having a stepped topography.
Figure 2:
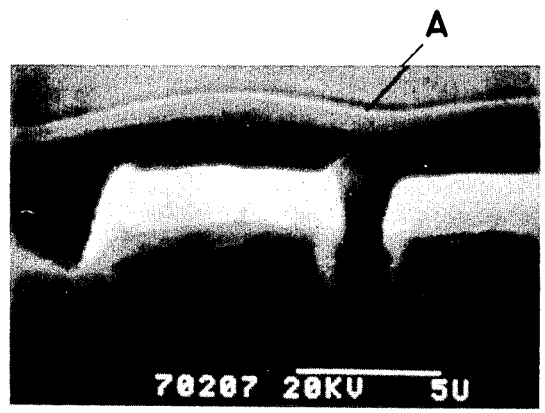
FIG. 2 is a cross section of a photomicrograph illustrating the prior art.

Referring to FIG. 1, an integrated circuit structure is shown generally at 10 having stepped portions 20. When a typical prior art solvent-based polymer material has been coated over the integrated circuit structure to provide a more planarized surface for the application of a photoresist or the like thereto, the resulting surface is represented by the dotted line shown at 30. Such an application of a solvent based polymer results in a surface, therefore, which is not planar although, of course, the degree of the steps has been reduced. This nonplanar surface is due, at least in part, to the evaporation of the solvent from the polymer which results in a nonuniform shrinkage or reduction of overall volume vertically based on the thickness of the polymer and solvent at any one place. An actual photograph of this phenomenon is shown in the photomicrograph of FIG. 2 with the arrow at A indicating the nonplanar surface resulting from a solvent based polymer which has been used as the planarization coating over an integrated circuit substrate having a stepped topography.

Still referring to FIG. 1, the solid line at 40 shows the surface which is formed by use of a polymerizable material in accordance with the invention. The planarization layer may be applied over an integrated circuit structure having a stepped topography by the use of a polymerizable material without the use of substantially any solvents. The use of such a polymerizable material, in the substantial absence of any solvents, results in the application to an integrated circuit structure having stepped topography of a material having a viscosity which will not be as subject to change during its application to the structure by conventional techniques such as, for example, by spinning the coating over the surface. In contrast, when a solvent based polymer is used, as in the conventional practice of the prior art, the solvent tends to at least partially evaporate during the spinning process resulting in a gradual change in the viscosity of the material as it flows from the center of the integrated circuit wafer to the periphery.

The term "polymerizable material", as used herein, is intended to define a material which may be a monomer; a relatively short chained polymer which may be subject to further polymerization, such as, for example, a saturated polymer which will form longer linear chains; or an unsaturated monomer or short chained polymer which may be subject to further polymerization and/or cross linking.

The polymerizable material, used in accordance with the invention, to form the planarization structure comprises a material having a sufficiently low viscosity during the application thereof to an integrated circuit structure to permit the flowing of the material across the surface to provide a uniformly coated surface without the use of substantially any solvents. By "substantially" is meant 20% by volume or less of solvents present (in contrast to the normal 50 to 75% solvent found in conventional polymers currently used). Furthermore, the particular polymerizable material is preselected to result in a minimum of shrinkage during the subsequent polymerization or curing of the material. By minimum shrinkage is meant a material which will have less than 20% by volume shrinkage, and preferably no more than 15% by volume shrinkage.

While the polymerizable material may comprise either a saturated material which is subject to further polymerization to form a longer chain thermoplastic polymer or, a crosslinkable polymerizable material; preferably the polymerizable material possesses sufficient unsaturation to provide a thermosetting material which will be capable of withstanding subsequent high temperature processing. Furthermore, the polymerizable material must be a material capable of providing low temperature stability and be polymerizable to form a coating layer which will not intermix with any subsequent layers of polymerizable material which may be applied thereto.

The polymerization reaction to which the polymerizable material is subjected after application to the integrated circuit structure may be a free radical, cationic, anionic, or condensation type reaction. The initiation of the polymerization may be by ultraviolet, infrared, heat, electron beam, gamma radiation, anaerobic, or chemical initiation. Preferably, due to the availability of ultraviolet light sources in normal processing of integrated circuit structures, the polymerization reaction should be initiatable by ultraviolet light, i.e., electromagnetic radiation of a wavelength of approximately 250 to 450 nanometers.

While, as stated above, the polymerizable material should be one which will exhibit a minimum of shrinkage, i.e., at least 20% or less shrinkage, it is within the scope of the invention to use materials which may exhibit somewhat higher shrinkage by modifying the polymerization to cause reaction of lower portions of the polymerizable material first, i.e., those portions which are in contact with the underlying step topography of the integrated circuit structure, by the use of longer wavelength ultraviolet light or short wavelength visible light, i.e., 400 to 450 nanometers which will result in more significant penetration of the light to initiate polymerization first of the layers in contact with the integrated circuit structure and then gradual polymerization of the remainder of the polymerizable material to minimize stresses which might otherwise be set up by shrinkage of such a polymerizable material in excess of 15 to 20% by volume.

Polymerizable materials which may be useful in the process of the invention include vinyl-based resins, epoxy resins, vinyl mercaptans, and some acrylic or polyester resins provided the shrinkage of such is less than 20% during polymerization. The particular polymerizable material used should have an initial viscosity in the range of from about 10 to 100 centipoise to facilitate the formation of a uniform initial coating of the integrated circuit structure prior to polymerization by spinning the structure at a speed of from 500 to 8000 rpms.

Figure 3:
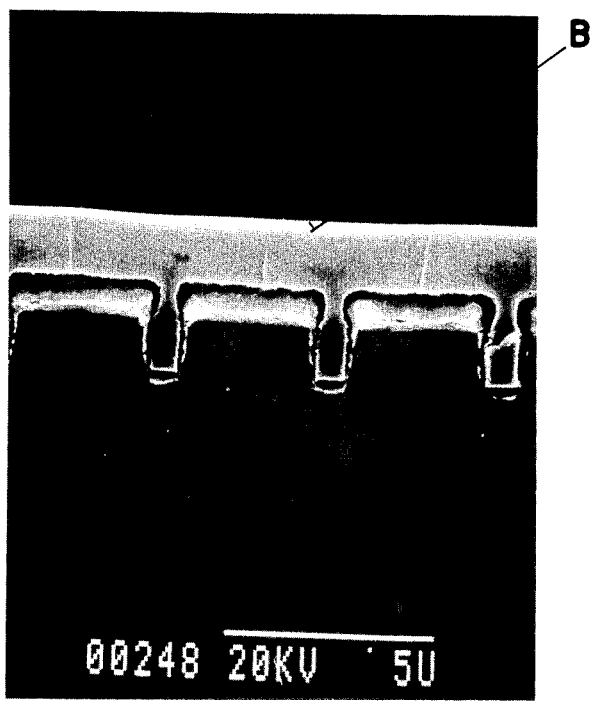
FIG. 3 is a photomicrograph illustrating the invention.

To illustrate the invention, a polymerizable material was prepared by mixing 2 parts by weight of a low viscosity cyclo aliphatic epoxide available from Union Carbide under the trademark UVR 6200 with 1 part of a medium viscosity cyclo aliphatic epoxide available from Union Carbide under the trademark ERL 4221. To the mixture was added 3%, by total weight of the epoxides, of a low viscosity initiator comprising an aromatic complex salt available from 3M under the trademark FX 512. Approximately 4 cc of the mixture was applied to the center of a 4 inch diameter integrated circuit wafer which was then spun at 6000 rpms to uniformly spread the polymerizable material across the surface of the wafer to provide a coating of about 1.5 to 2 microns thick. The material was then polymerized by exposing the coated wafer for 30 seconds under a Veeco ultraviolet light Model #PSS-200 having wavelengths of 250 to 450 nanometers while baking the material at 90° C. The resultant coated wafer had a substantially uniform planar surface thereon as shown at the arrow B in the photomicrograph of FIG. 3.

Thus, the invention provides for the planarization of an integrated circuit structure having stepped topography by the use of a polymerizable material in the substantial absence of a solvent whereby subsequent polymerization of the material will result in the formation of a solid material forming a planar substrate for a subsequent layer of photoresist wherein the absence of solvent results in a minimum of shrinkage to provide a degree of planarization of the polymerized material not heretofore possible with the use of polymerizable materials dissolved in solvents which will evaporate.

Having thus described the invention, what is claimed is:

1. An improvement in the process of manufacturing an integrated circuit structure having stepped topography which comprises coating said integrated circuit structure with a polymerizable monomer without the use of substantially any solvents and then polymerizing said monomer on said structure to provide a substantially planar surface on said integrated circuit structure, whereby the volume change of said polymerizable monomer, as said monomer is polymerized from a flowable monomer to a solid material, is materially reduced to permit maintenance, during polymerization, of the substantially planar surface obtained while applying said monomer to said integrated circuit structure.

2. The process of claim 1 wherein said monomer is applied to said structure by application of a sufficient amount of said monomer to a central region of said structure followed by spinning said structure at a speed sufficient to permit flow of said material to the peripheral portions of said structure to form a substantially planar surface.

3. The process of claim 2 wherein said polymerizable monomer has an initial viscosity of from 10 to 100 centipoise when initially spun onto said integrated circuit structure to permit said monomer to evenly flow across said structure to form said substantially planar surface.

4. The process of claim 3 wherein the step of polymerizing said polymerizable monomer includes exposing said monomer coated on said integrated circuit substrate to an external source of energy selected from the class consisting of ultraviolet radiation, infrared radiation, gamma radiation, and an electron beam.

5. The process of claim 3 wherein a polymerization catalyst is incorporated into said polymerizable monomer.

6. The process of claim 3 wherein said polymerizable monomer comprises a thermoplastic material.

7. The process of claim 3 wherein said polymerizable monomer is capable of cross-linking to form a thermosetting material.

8. The process of claim 4 wherein said polymerizable monomer is selected to permit sufficient polymerization to form a solid material without shrinking more than 20% by volume to thereby permit maintenance of said substantially planar surface during said polymerization and without the formation of excessive stress of said underlying integrated circuit structure.

9. The process of claim 8 wherein said polymerizable monomer is selected from the class consisting of an epoxy, a vinyl, an acrylic, a methacrylic, vinyl mercapto, and a polyester material.

10. The process of claim 9 wherein said polymerizable monomer is an epoxy material.

11. The process of claim 10 wherein said epoxy material is polymerized by exposure to ultraviolet light.

12. The process of claim 11 wherein said ultraviolet light has a wavelength of from 250 to 450 nanometers and said epoxy is polymerized by exposure to said energy source for from 0.1 to 60 seconds.

13. The process of claim 12 wherein said epoxy material is polymerized by exposure to ultraviolet light while exposed to an elevated temperature of from 30° to 100° C.

14. An improvement in the process of forming a planarization layer over an integrated circuit structure having stepped topography comprising:
   (a) centrally applying to said structure a polymerizable epoxy material having a viscosity of 10 to 100 centipoise and a substantial absence of nonpolymerizable solvents;
   (b) spinning said structure at a speed of from 500 to 8000 rpms to spread said epoxy material evenly across the surface of said integrated circuit structure; and
   (c) polymerizing said epoxy material by exposing said coated structure to ultraviolet light to form a planarized layer on said integrated circuit structure suitable for application of a photoresist layer thereto.

15. An integrated circuit structure having stepped topography and a planarization layer applied thereover consisting of a polymerizable monomer which is polymerized after application of said monomer in the substantial absence of solvents over said stepped topography to provide a substantially planar surface thereon.

* * * * *

Adverse Decisions In Interference

Patent No. 4,619,837, Andrew V. Brown, POLYMERIZABLE PLANARIZATION LAYER FOR INTEGRATED CIRCUIT STRUCTURES, Interference No. 102,814, final judgment adverse to the patentee rendered June 30, 2000, as to claims 1-14.
*(Official Gazette October 31, 2000)*